（12) United States Patent
Dai (10) Patent No.: US 9,514,695 B2
(45) Date of Patent: Dec. 6, 2016

(54) GATE DRIVER ON ARRAY CIRCUIT AND LIQUID CRYSTAL DISPLAY DEVICE

(71) Applicant: Shenzhen China Star Optoelectronics Technology Co., Ltd., Guangdong (CN)

(72) Inventor: Chao Dai, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 183 days.

(21) Appl. No.: 14/416,139

(22) PCT Filed: Nov. 5, 2014

(86) PCT No.: PCT/CN2014/090293
§ 371 (c)(1),
(2) Date: Jan. 21, 2015

(87) PCT Pub. No.: WO2016/065657
PCT Pub. Date: May 6, 2016

(65) Prior Publication Data
US 2016/0125824 A1    May 5, 2016

(30) Foreign Application Priority Data
Oct. 31, 2014    (CN) .......................... 2014 1 0605754

(51) Int. Cl.
*G09G 3/36* (2006.01)
*G11C 19/28* (2006.01)

(52) U.S. Cl.
CPC .......... *G09G 3/3648* (2013.01); *G09G 3/3677* (2013.01); *G11C 19/28* (2013.01); *G09G 3/3696* (2013.01); *G09G 2310/0205* (2013.01); *G09G 2310/0286* (2013.01); *G09G 2310/08* (2013.01)

(58) Field of Classification Search
CPC .. G09G 3/3648; G09G 3/3677; G09G 3/3696; G09G 2310/08; G09G 2310/0286; G09G 2310/0205; G11C 19/28
See application file for complete search history.

(56) References Cited

U.S. PATENT DOCUMENTS

| 9,203,395 B2 * | 12/2015 | Kim ...................... G09G 3/3677 |
| 9,240,156 B2 * | 1/2016 | Dai ...................... G02F 1/13306 |
| 9,383,841 B2 * | 7/2016 | Lin ........................ G06F 3/041 |
| 9,407,260 B2 * | 8/2016 | Xiao .................... G09G 3/3655 |

(Continued)

FOREIGN PATENT DOCUMENTS

| CN | 103021360 | 4/2013 |
| CN | 103077689 | 5/2013 |

(Continued)

Primary Examiner — Christopher E Leiby (57) ABSTRACT

A gate driver on array circuit and a liquid crystal display device are disclosed. The $N^{th}$-level GOA unit comprises: a pull-down unit; the pull-down unit comprises a first thin film transistor (TFT) which is connected to the input end of the $(n+2)^{th}$-level high-frequency clock signal and a pull-down control unit respectively; the first TFT, a pull-up unit and a pull-up control unit are commonly connected to the pull-down point so as to pull-down the electrical potential of the pull-down point, wherein N is a positive integer greater than 3; n is positive integer.

20 Claims, 5 Drawing Sheets

(56) References Cited

U.S. PATENT DOCUMENTS

| | | | |
|---|---|---|---|
| 2008/0048712 A1* | 2/2008 | Ahn | G09G 3/3677 326/21 |
| 2010/0171728 A1 | 7/2010 | Han et al. | |
| 2012/0105393 A1* | 5/2012 | Tan | G09G 3/3677 345/204 |
| 2012/0140871 A1* | 6/2012 | Yang | G09G 3/20 377/79 |
| 2013/0135284 A1* | 5/2013 | Tseng | G11C 19/28 345/212 |
| 2014/0103983 A1* | 4/2014 | Chang | G09G 3/3655 327/198 |
| 2014/0105351 A1* | 4/2014 | Chan | G11C 19/184 377/64 |
| 2015/0002504 A1* | 1/2015 | Jo | G09G 3/3677 345/213 |
| 2015/0009113 A1 | 1/2015 | Zeng et al. | |
| 2015/0029082 A1* | 1/2015 | Jeon | G11C 19/28 345/98 |
| 2015/0077319 A1* | 3/2015 | Yao | G09G 3/20 345/100 |
| 2015/0187320 A1 | 7/2015 | Ren | |
| 2015/0194112 A1* | 7/2015 | Koo | G09G 3/3648 345/92 |
| 2015/0371599 A1* | 12/2015 | Xiao | G09G 3/20 345/212 |
| 2016/0005372 A1* | 1/2016 | Yu | G09G 3/3677 345/208 |
| 2016/0064098 A1* | 3/2016 | Han | G11C 19/28 345/211 |
| 2016/0140928 A1* | 5/2016 | Xiao | G09G 3/3648 345/212 |

FOREIGN PATENT DOCUMENTS

| | | |
|---|---|---|
| CN | 103310755 | 9/2013 |
| CN | 103928001 | 7/2014 |
| CN | 104050941 | 9/2014 |

* cited by examiner

GATE DRIVER ON ARRAY CIRCUIT AND LIQUID CRYSTAL DISPLAY DEVICE

RELATED APPLICATIONS

This application is a National Phase of PCT Patent Application No. PCT/CN2014/090293 having International filing date of Nov. 5, 2014, which claims the benefit of priority of Chinese Patent Application No. 201410605754.X filed on Oct. 31, 2014. The contents of the above applications are all incorporated by reference as if fully set forth herein in their entirety.

FIELD OF THE INVENTION

The present invention relates to a technical field of displays, and more particularly to a gate driver on array circuit and a liquid crystal display device.

BACKGROUND OF THE INVENTION

A gate driver on array circuit is abbreviated as a GOA circuit. GOA circuits use the existing TFT-LCD (Thin Film Transistor-Liquid Crystal Display) array process technology to manufacture a gate-line scan driving signal circuit on an array substrate that implements a driving method of progressively scanning the gate.

Presently, oxide semiconductor thin film transistors receive more and more attention for their good electrical properties, and the integration of an oxide semiconductor thin film transistor into a driving circuit of a liquid crystal display is thus applied more widely. For oxide semiconductor thin film transistors, due to their electrical properties, the threshold voltage is sometimes less than 0V.

Figure 1:
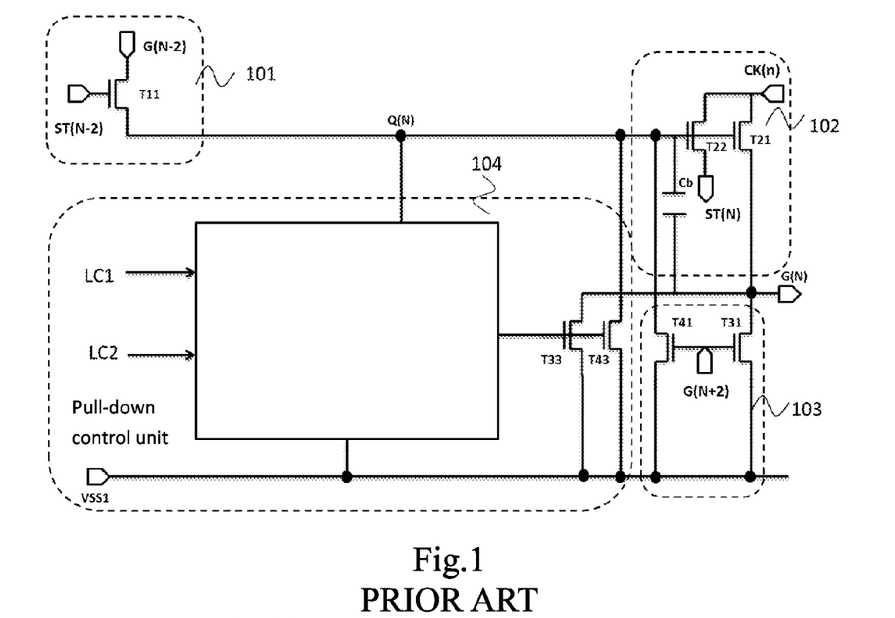
FIG. 1 is a structural diagram of an $N^{th}$-level GOA unit in the prior art.

A structural diagram of an existing $N^{th}$-level GOA unit is illustrated in FIG. 1, which mainly comprises: a pull-up control unit 101, a pull-up unit 102, a pull-down unit 103, and a pull-down control unit 104. In the actual practice process, the pull-down unit 103 has an obvious electrical leakage phenomenon. A drain input signal of a TFT 11 is ST(N−2). A gate input signal of a TFT T41 and T31 is G(N+2). A drain input clock signal of a TFT T21 and a TFT T22 is CK(n). An output signal of a first output end is G(N). An output signal of a second output end is ST(N). A pull-down point Q(N), a low-level input end (VSS1), the TFT T43, the TFT T33, and signals LC1 and LC2 of the low-level input end belong to the pull-down control unit. Since the specific structure of the pull-down control unit 104 has been recorded in the existing technology, the detailed description thereof is omitted here.

Figure 2:
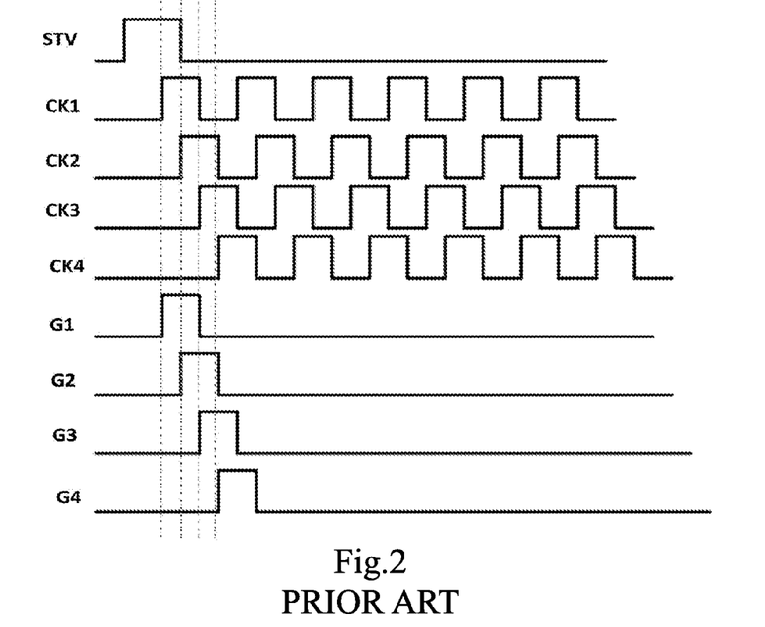
FIG. 2 is a schematic diagram of waveforms of a GOA circuit in the prior art.

As illustrated in FIG. 2, STV represents a starting signal of the GOA circuit. CK1-CK4 represent clock signals comprised in the GOA circuit. G1-G4 represent signals of first output ends of the $1^{st}$-$4^{th}$-level GOA units. A clock signal period of a next level GOA unit has a 1/4 period overlap with a clock signal period of a previous level GOA unit. The duty ratios of the clock signals are both 50/50. When the TFT T21 is closed, the gate of the TFT T21 is connected to VSS1, and the source is connected to VSS1, so that VGS=0V. There is a larger problem of electrical leakage when the threshold voltage of the TFT is less than 0V.

As a result, it is necessary to provide a GOA circuit and a liquid crystal display device to solve the problems existing in the conventional technologies.

SUMMARY OF THE INVENTION

An object of the present invention is to provide a GOA circuit and a liquid crystal display device. The present invention solves the electrical leakage problem which appears at a pull-down unit in the prior art so as to improve the display result of a liquid crystal display.

To solve the above problem, the present invention provides a GOA circuit which comprises multi-level connected GOA units and multi-level high frequency clock signals, each of the multi-level high-frequency clock signals being input through a corresponding-level high-frequency clock signal input end, wherein an $N^{th}$-level GOA unit comprises:

a first input end of an $(N−1)^{th}$-level signal, a second input end of the $(N−1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n represents a level number of the high-frequency clock signal which are comprised in the GOA circuit;

wherein the first input end of the $(N−1)^{th}$-level signal is connected to a first output end of an $(N−1)^{th}$-level GOA unit; the second input end of the $(N−1)^{th}$-level signal is connected to a second output end of the $(N−1)^{th}$-level GOA unit; the first output end is connected to a first input end of an $(N−1)^{th}$-level signal of an $(N+1)^{th}$-level GOA unit; the second output end is connected to a second input end of the $(N−1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprises:

a pull-up control unit connected to the first input end of the $(N−1)^{th}$-level signal, the second input end of the $(N−1)^{th}$-level signal and the pull-down point respectively; wherein the pull-up control unit is used to pull up an electrical potential of the pull-down point;

a pull-up unit connected to the input end of the $n^{th}$-level high-frequency clock signal, the first output end and the second output end respectively; wherein the pull-up unit and the pull-up control unit are commonly connected to the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprising a first thin film transistor (TFT), wherein the first TFT has a first gate, a first source and a first drain; the first gate is electrically connected to the input end of the $(n+2)^{th}$-level high-frequency clock signal; the first source, the pull-up unit and the pull-up control unit are commonly connected to the pull-down point; and the first drain and the pull-down control unit are commonly connected to the first output end so as to pull-down the electrical potential of the pull-down point;

wherein the GOA circuit comprises a first cascade aspect and a second cascade aspect, the first cascade aspect and the second aspect are not mutually cascaded with each other, the first cascade aspect is composed by multiple $(2k+1)^{th}$-level GOA units cascaded, the second cascade aspect is composed by multiple $(2k)^{th}$-level GOA units cascaded, and the first cascade aspect and the second cascade aspect are driven independently, wherein k is a positive integer.

In the GOA circuit of the present invention, duty ratios of clock signals of the first cascade aspect and the second cascade aspect are both 1/3.

In the GOA circuit of the present invention, the pull-up control unit comprises a second TFT; and the second TFT has a second gate, a second source and a second drain;

wherein the second gate is connected to the second input end of the $(N-1)^{th}$ signal; the second drain is connected to the first signal input end of the $(N-1)^{th}$ signal; and the second source is connected to the pull-down point.

In the GOA circuit of the present invention, the pull-up unit comprises a capacitor, a third TFT and a fourth TFT; the third TFT has a third gate, a third source and a third drain; and the fourth TFT has a fourth gate, a fourth source and a fourth drain;

wherein the third gate, the fourth gate and an end of the capacitance are commonly connected to the pull-down point; the third drain and the fourth drain are commonly connected to the input end of the $n^{th}$-level high-frequency clock signal; the third source and the other end of the capacitance are connected to the first output end; and the fourth source is connected to the second output end.

In the GOA circuit of the present invention, the low-level input end comprises a first low-level input end and a second low-level input end; the $N^{th}$-level GOA unit further comprises a first input end of a low-frequency clock signal and a second input end of the low-frequency clock signal; the pull-down control unit comprises a first pull-down control unit; and the first pull-down control unit comprises:

a fifth TFT, a sixth TFT and a seventh TFT, wherein the fifth TFT has a fifth gate, a fifth source and a drain; the sixth TFT has a sixth gate, a sixth source and a sixth drain; and the seventh TFT has a seventh gate, a seventh source and a seventh drain;

wherein the fifth source is connected to the second source; the fifth drain is connected to the second low-level input end; and the fifth gate and the sixth gate are commonly connected to a ninth source and a tenth drain;

the sixth source is connected to the first output end; and the sixth drain is connected to the first low-level input end;

the seventh gate is connected to the pull-down point; the seventh drain is connected to the first low-level input end; and the seventh source is connected to a ninth gate and an eighth source;

the first pull-down control unit further comprises:

an eighth TFT, a ninth TFT and a tenth TFT, wherein the eighth TFT has an eighth gate, an eighth source and an eighth drain; the ninth TFT has a ninth gate, a ninth source and a ninth drain; and the tenth TFT has a tenth gate, a tenth source and a tenth drain;

wherein the eighth gate, the eighth drain, the ninth drain and the tenth source are commonly connected to the first input end of the low-frequency clock signal;

the ninth gate is connected to the eighth source, and the ninth source is connected to the sixth gate;

the tenth gate is connected to the second input end of the low-frequency clock signal; and the tenth drain is connected to the sixth gate.

In the GOA circuit of the present invention, the pull-down control unit further comprises a second pull-down control sub-unit; and the second pull-down control unit comprises:

an eleventh TFT, a twelfth TFT and a thirteenth TFT, wherein the eleventh TFT has an eleventh gate, an eleventh source and an eleventh drain; the twelfth TFT has a twelfth gate, a twelfth source and a twelfth drain; and the thirteenth TFT has a thirteenth gate, a thirteenth source and a thirteenth drain;

wherein the eleventh drain is connected to the pull-up point; the eleventh source is connected to the second low-level input end; and the eleventh gate and the twelfth gate are commonly connected to a fifteenth drain and a sixteenth source;

the twelfth drain is connected to the first input end; and the twelfth source is connected to the first low-level input end;

the thirteenth gate is connected to the pull-down point; the thirteenth source is connected to the first low-level input end; and the thirteenth drain is connected to a fifteen gate and a fourteenth drain;

the second pull-down control unit further comprises:

a fourteenth TFT, a fifteenth TFT and a sixteenth TFT, wherein the fourteenth TFT has a fourteenth gate, a fourteenth source and a fourteenth drain; the fifteenth TFT has a fifteenth gate, a fifteenth source and a fifteenth drain; and the sixteenth TFT has a sixteenth gate, a sixteenth source and a sixteenth drain;

wherein the fourteenth source, the fourteenth gate, the fifteenth source and the sixteenth drain are commonly connected to the second input end of the low-frequency clock signal;

the fifteenth gate is connected to the fourteenth drain; and the fifteenth drain is connected to the twelfth gate;

the sixteenth gate is connected to the first input end of the low-frequency clock signal; and the sixteenth source is connected to the twelfth gate.

In the GOA circuit of the present invention, the pull-down control unit further comprises a bridged unit, and the bridged unit comprises:

a seventeenth TFT having a seventeenth gate, a seventeenth source and a seventeenth drain, wherein the seventeenth gate is connected to the pull-down point; the seventeenth drain is connected to the sixth gate; and the seventeenth source is connected to the twelfth gate.

The present invention provides a GOA circuit which comprises multi-level connected GOA units and multi-level high frequency clock signals, each of the multi-level high-frequency clock signals being input through a corresponding-level high-frequency clock signal input end, wherein an $N^{th}$-level GOA unit comprises:

a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n represents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end connected to a second input end of the $(N-1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprises:

a pull-up control unit connected to the first input end of the $(N-1)^{th}$-level signal, the second input end of the $(N-1)^{th}$-level signal and the pull-down point respectively; the pull-up control unit used to pull up an electrical potential of the pull-down point;

a pull-up unit connected to the input end of the $n^{th}$-level high-frequency clock signal, the first output end and the second output end respectively; wherein the pull-up unit and the pull-up control unit are commonly connected to the pull-down point; and the pull-up unit is used to charge signals of the first output end and the second output end so as to raise the pull-down point to a higher electrical potential;

a pull-down control unit is connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprises a first TFT. The pull-down unit is connected to the input end of the $(n+2)^{th}$-level high-frequency clock signal and the pull-up control unit respectively; wherein the pull-down unit, the pull-up unit and the pull-up control unit are commonly connected to the pull-down point so as to pull-down the electrical potential of the pull-down point.

In the GOA circuit of the present invention, the first TFT has a first gate, a first source and a first drain; the first gate is electrically connected to the input end of the $(n+2)^{th}$-level high-frequency clock signal; the first source is electrically connected to the pull-down point; and the first drain and the pull-down control unit are commonly connected to the first output end.

In the GOA circuit of the present invention, the GOA circuit comprises a first cascade aspect and a second cascade aspect; the first cascade aspect and the second aspect are not mutually cascaded with each other; the first cascade aspect is composed of multiple $(2k+1)^{th}$-level GOA units cascaded; the second cascade aspect is composed of multiple $(2k)^{th}$-level GOA units cascaded; and the first cascade aspect and the second cascade aspect are driven independently, wherein k is a positive integer.

In the GOA circuit of the present invention, duty ratios of clock signals of the first cascade aspect and the second cascade aspect are both 1/3.

In the GOA circuit of the present invention, the pull-up control unit comprises a second TFT; and the second TFT has a second gate, a second source and a second drain;

wherein the second gate is connected to the second input end of the $(N-1)^{th}$ signal; the second drain is connected to the first signal input end of the $(N-1)^{th}$ signal; and the second source is connected to the pull-down point.

In the GOA circuit of the present invention, the pull-up unit comprises a capacitor, a third TFT and a fourth TFT; the third TFT comprises a third gate, a third source and a third drain; and the fourth TFT comprises a fourth gate, a fourth source and a fourth drain;

wherein the third gate, the fourth gate and an end of the capacitance are commonly connected to the pull-down point; the third drain and the fourth drain are commonly connected to the input end of the $n^{th}$-level high-frequency clock signal; the third source and the other end of the capacitance are connected to the first output end; and the fourth source is connected to the second output end.

In the GOA circuit of the present invention, the low-level input end comprises a first low-level input end a second low-level input end; the $N^{th}$-level GOA unit further comprises a first input end of a low-frequency clock signal and a second input end of the low-frequency clock signal; the pull-down control unit comprises a first pull-down control unit; and the first pull-down control unit comprises:

a fifth TFT, a sixth TFT and a seventh TFT, the fifth TFT has a fifth gate, a fifth source and a drain; wherein the sixth TFT has a sixth gate, a sixth source and a sixth drain; and the seventh TFT has a seventh gate, a seventh source and a seventh drain;

wherein the fifth source is connected to the second source; the fifth drain is connected to the second low-level input end; and the fifth gate and the sixth gate are commonly connected to a ninth source and a tenth drain;

the sixth source is connected to the first output end; and the sixth drain is connected to the first low-level input end;

the seventh gate is connected to the pull-down point; the seventh drain is connected to the first low-level input end; and the seventh source is connected to a ninth gate and an eighth source;

the first pull-down control unit further comprises:

an eighth TFT, a ninth TFT and a tenth TFT, wherein the eighth TFT has an eighth gate, an eighth source and an eighth drain; the ninth TFT has a ninth gate, a ninth source and a ninth drain; and the tenth TFT has a tenth gate, a tenth source and a tenth drain;

wherein the eighth gate, the eighth drain, the ninth drain and the tenth source are commonly connected to the first input end of the low-frequency clock signal;

the ninth gate is connected to the eighth source; and the ninth source is connected to the sixth gate;

the tenth gate is connected to the second input end of the low-frequency clock signal; and the tenth drain is connected to the sixth gate.

In the GOA circuit of the present invention, the pull-down control unit further comprises a second pull-down control sub-unit, and the second pull-down control unit comprises:

an eleventh TFT, a twelfth TFT and a thirteenth TFT, wherein the eleventh TFT has an eleventh gate, an eleventh source and an eleventh drain; the twelfth TFT has a twelfth gate, a twelfth source and a twelfth drain; and the thirteenth TFT has a thirteenth gate, a thirteenth source and a thirteenth drain;

wherein the eleventh drain is connected to the pull-up point; the eleventh source is connected to the second low-level input end; and the eleventh gate and the twelfth gate are commonly connected to a fifteenth drain and a sixteenth source;

the twelfth drain is connected to the first input end; and the twelfth source is connected to the first low-level input end;

the thirteenth gate is connected to the pull-down point; the thirteenth source is connected to the first low-level input end; and the thirteenth drain is connected to a fifteen gate and a fourteenth drain;

the second pull-down control unit further comprises:

a fourteenth TFT, a fifteenth TFT and a sixteenth TFT, wherein the fourteenth TFT has a fourteenth gate, a fourteenth source and a fourteenth drain; the fifteenth TFT has a fifteenth gate, a fifteenth source and a fifteenth drain; and the sixteenth TFT has a sixteenth gate, a sixteenth source and a sixteenth drain;

wherein the fourteenth source, the fourteenth gate, the fifteenth source and the sixteenth drain are commonly connected to the second input end of the low-frequency clock signal;

the fifteenth gate is connected to the fourteenth drain; and the fifteenth drain is connected to the twelfth gate;

the sixteenth gate is connected to the first input end of the low-frequency clock signal; and the sixteenth source is connected to the twelfth gate.

In the GOA circuit of the present invention, the pull-down control unit further comprises a bridged unit; and the bridged unit comprises:

a seventeenth TFT having a seventeenth gate, a seventeenth source and a seventeenth drain, wherein the seventeenth gate is connected to the pull-down point; the seventeenth drain is connected to the sixth gate; and the seventeenth source is connected to the twelfth gate.

A liquid crystal display device, comprising a GOA circuit and a display area connected to the GOA circuit, the GOA circuit comprising multi-level connected GOA units and multi-level high frequency clock signals, each of the multi-level high-frequency clock signals being input through a corresponding-level high-frequency clock signal input end, wherein an $N^{th}$-level GOA unit comprises:

a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n presents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end is connected to a second input end of the $(N-1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprises:

a pull-up control unit connected to the first input end of the $(N-1)^{th}$-level signal, the second input end of the $(N-1)^{th}$-level signal and the pull-down point respectively; wherein the pull-up control unit is used to pull up an electrical potential of the pull-down point;

a pull-up unit connected to the input end of the $n^{th}$-level high-frequency clock signal, the first output end, and the second output end respectively; wherein the pull-up unit and the pull-up control unit are commonly connected the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprising a first TFT, wherein the pull-down unit is connected to the input end of the $(n+2)^{th}$-level high-frequency clock signal and the pull-up control unit respectively; the pull-down unit, the pull-up unit and the pull-up control unit are commonly connected to the pull-down point so as to pull-down the electrical potential of the pull-down point.

In the liquid crystal display device of the present invention, the first TFT has a first gate, a first source and a first drain.

wherein the first gate is electrically connected to the input end of the $(n+2)^{th}$-level high-frequency clock signal; the first source is electrically connected to the pull-down point; and the first drain and the pull-down control unit are commonly connected to the first output end.

In the liquid crystal display device of the present invention, the GOA circuit comprises a first cascade aspect and a second cascade aspect; the first cascade aspect and the second aspect are not mutually cascaded with each other; the first cascade aspect is composed of multiple $(2k+1)^{th}$-level GOA units cascaded; the second cascade aspect is composed of multiple $(2k)^{th}$-level GOA units cascaded; and the first cascade aspect and the second cascade aspect are driven independently, wherein k is a positive integer.

In the liquid crystal display device of the present invention, duty ratios of clock signals of the first cascade aspect and the second cascade aspect are both 1/3.

The GOA circuit and the liquid crystal display device of the present invention solve the electrical leakage problem of a GOA circuit in the prior art by improving the pull-down unit in the prior art, so as to improve the display result of a liquid crystal display.

To allow the above description of the present invention to be more clear and comprehensive, there are preferred embodiments with the accompanying figures described in detail below.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In the drawings, units with similar structures are represented by the same label.

Figure 3:
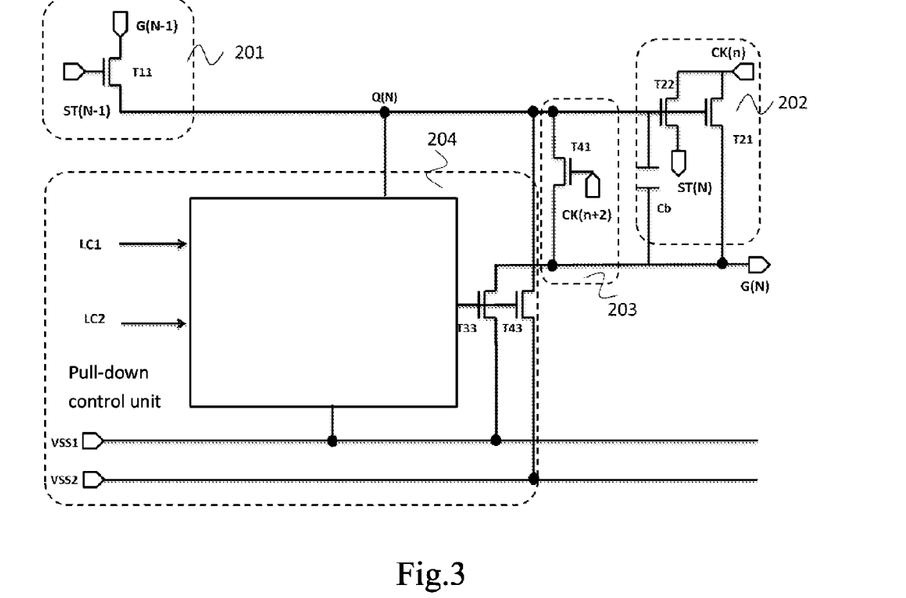
FIG. 3 is a schematic diagram of an $N^{th}$-level GOA unit according to a first embodiment of the present invention.

Referring to FIG. 3, FIG. 3 is a schematic diagram of an $N^{th}$-level GOA unit according to a first embodiment of the present invention.

As illustrated in FIG. 3, the GOA circuit of the present invention comprises multi-level connected GOA units and multi-level high frequency clock signals, each of the multi-level high-frequency clock signals being input through a corresponding-level high-frequency clock signal input end, wherein an $N^{th}$-level GOA unit comprises: a signal of a first input end of a $(N-1)^{th}$-level signal is G(N-1); a signal of a second input end of the (N−1)$^{th}$-level signal is ST(N−1); a signal of an input end of an (n+2)$^{th}$-level high-frequency clock signal is CK(n+2); a signal of a first input end is G(N); a signal of a second output end is ST(N); a signal of a pull-down point is Q(N); a low-level input end; and a signal of an input end of an n$^{th}$-level high-frequency clock signal is CK(n), wherein N is a positive integer greater than 3; n is positive integer; and n represents a level number of the high-frequency clock signal which is comprised in the GOA circuit;

The high-frequency clock signals of n levels are input to the GOA units of N levels respectively. For example, a first level high-frequency clock signal is input to a first level GOA unit, a second level high-frequency clock signal is input to a second level GOA unit, and so on. The above method is further implemented as follows: a third level high-frequency clock signal is input to the first level GOA unit, a fourth level high-frequency clock signal is input to the second level GOA unit, the first level high-frequency clock signal is input to a third level GOA unit, and the second level high-frequency clock signal is input to a fourth level GOA unit. Of course there can be other ways; however, they are not enumerated herein.

The first input end of the (N−1)$^{th}$-level signal is connected to a first output end of an (N−1)$^{th}$-level GOA unit; the second input end of the (N−1)$^{th}$-level signal is connected to a second output end of the (N−1)$^{th}$-level GOA unit; the first output end is connected to a first input end of an (N−1)$^{th}$-level signal of an (N+1)$^{th}$-level GOA unit; the second output end is connected to a second input end of the (N−1)$^{th}$-level signal of the (N+1)$^{th}$-level GOA unit; and the first output end is used to offer a scanning signal to an N$^{th}$-level horizontal scan line of a display area;

The N$^{th}$-level GOA unit further comprises:

a pull-up control unit 201, a pull-up unit 202, a pull-down unit 203, and a pull-down control unit 204.

The pull-up control unit 201 is connected to the first input end of the (N−1)$^{th}$-level signal, the second input end of the (N−1)$^{th}$-level signal and the pull-down point respectively; the pull-up control unit 201 is used to pull up an electrical potential of the signal Q(N) of the pull-down point so as to control the pull-up unit 202 to open or not.

The pull-up unit 202 is connected to the input end of the n$^{th}$-level high-frequency clock signal, the first output end and the second output end respectively; the pull-up unit 202 and the pull-up control unit 201 are commonly connected to the pull-down point; and the pull-up unit 202 is used to charge signal G(N) of the first output end so as to raise the signal G(N) of the pull-down point to a higher electrical potential;

The pull-down control unit 204 is connected to the low-level input end, the pull-up control unit 201, the pull-up unit 202 and the pull-down unit 203 respectively. The pull-down control unit 204 is used to control the pull-down point and the first output end to remain at a low electrical potential when the signal of the first output end is in a non-charging state (Namely, the CK(n) is low-level). The concrete structure of the pull-down control unit 204 is described in detail in the second embodiment of the present invention and FIG. 4.

The pull-down unit 203 comprises a first TFT. The pull-down unit is connected to the input end of the (n+2)$^{th}$-level high-frequency clock signal and the pull control unit. The pull-down unit, the pull-up unit and the pull-up control unit are commonly connected to the pull-down point so as to pull-down the electrical potential of the pull-down point.

The difference between the present invention and the prior art is as follows: there is only one TFT configured in the pull-down unit, but there are two TFTs used in the prior art. The pull-down unit 203 of the present invention comprises: a first TFT T41. The first TFT T41 has a first gate, a first source and a first drain; the first gate is electrically connected to the input end of the (n+2)$^{th}$-level high-frequency clock signal; the first source is electrically connected to the signal; the first drain and the pull-down control unit 204 are commonly connected to the first output end.

Preferably, the pull-up control unit 201 comprises a second TFT T11; and the second TFT T11 has a second gate, a second source and a second drain;

The second gate is connected to the second input end of the (N−1)$^{th}$ signal; the second drain is connected to the first signal input end of the (N−1)$^{th}$ signal; and the second source is connected to the pull-down point.

The pull-up unit 202 comprises a capacitor Cb, a third TFT T21 and a fourth TFT T22; the third TFT T21 has a third gate, a third source and a third drain; and the fourth TFT T22 has a fourth gate, a fourth source and a fourth drain;

The third gate, the fourth gate and an end of the capacitance are commonly connected to the pull-down point; the third drain and the fourth drain are commonly connected to the input end of the n$^{th}$-level high-frequency clock signal; the third source and the other end of the capacitance are connected to the first output end; and the fourth source is connected to the second output end.

Figure 4:
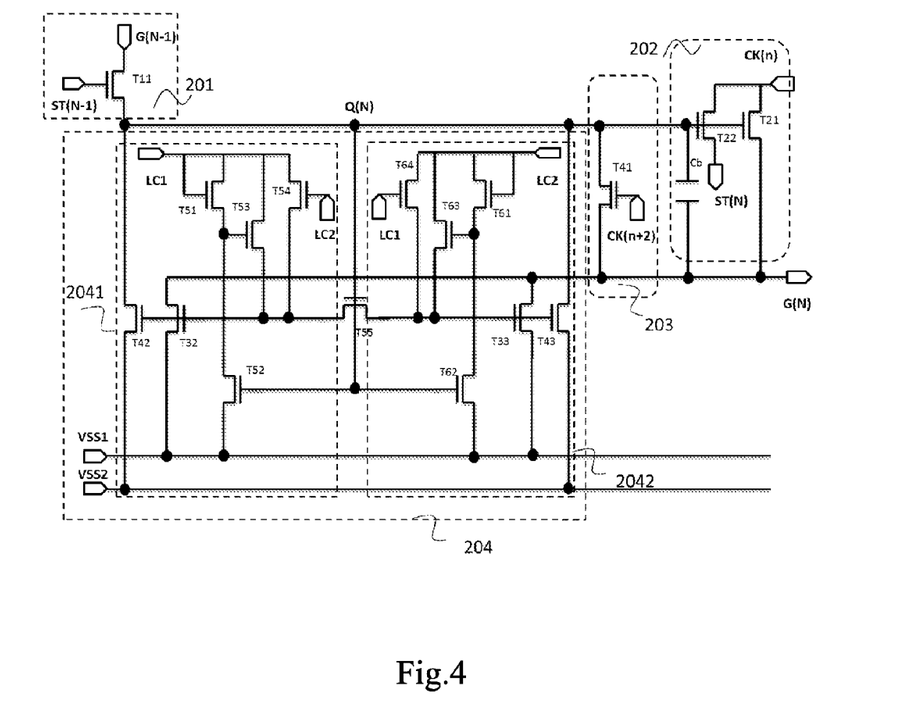
FIG. 4 is a schematic diagram of an $N^{th}$-level GOA unit according to a second embodiment of the present invention.

FIG. 4 is a schematic diagram of an N$^{th}$-level GOA unit according to a second embodiment of the present invention. There is a preferable way of the pull-down control unit 204 in this embodiment, the rest of the second embodiment is the same as the first embodiment.

Referring to FIG. 4, the N$^{th}$-level GOA unit further comprises: a signal LC1 of the first input end of the low-frequency clock signal and a signal LC2 of the second input end of the low-frequency clock signal; the low-level input end comprises a signal VSS1 of a first low-level input end, and a signal VSS2 of a second low-level input end; the pull-down control unit 204 comprises: a first pull-down control unit 2041;

The first pull-down control unit 2041 comprises:

a fifth TFT T42, a sixth TFT T32 and a seventh TFT T52, the fifth TFT T42 has a fifth gate, a fifth source and a drain; wherein the sixth TFT T32 has a sixth gate, a sixth source and a sixth drain; and the seventh TFT T52 has a seventh gate, a seventh source and a seventh drain;

The fifth source is connected to the second source; the fifth drain is connected to the second low-level input end; and the fifth gate and the sixth gate are commonly connected to a ninth source and a tenth drain;

The sixth source is connected to the first output end; and the sixth drain is connected to the first low-level input end; the seventh gate is connected to the pull-down point; the seventh drain is connected to the first low-level input end; and the seventh source is connected to a ninth gate and an eighth source;

The first pull-down control unit further comprises:

an eighth TFT T51, a ninth TFT T53 and a tenth TFT T54, wherein the eighth TFT T51 has an eighth gate, an eighth source and an eighth drain; the ninth TFT T53 has a ninth gate, a ninth source and a ninth drain; and the tenth TFT T54 has a tenth gate, a tenth source and a tenth drain;

The eighth gate, the eighth drain, the ninth drain and the tenth source are commonly connected to the first input end of the low-frequency clock signal; the eighth source is connected to the seventh source;

The ninth gate is connected to the eighth source; the ninth source is connected to the sixth gate; the tenth gate is connected to the second input end of the low-frequency clock signal; and the tenth drain is connected to the sixth gate.

The pull-down control unit further comprises a second pull-down control sub-unit 2042, and the second pull-down control unit 2042 comprises:

an eleventh TFT T43, a twelfth TFT T33 and a thirteenth TFT T62, wherein the eleventh TFT T43 has an eleventh gate, an eleventh source and an eleventh drain; the twelfth TFT T33 has a twelfth gate, a twelfth source and a twelfth drain; and the thirteenth TFT T62 has a thirteenth gate, a thirteenth source and a thirteenth drain;

The eleventh drain is connected to the second drain through the pull-up point, and the eleventh drain is connected to the first source; the eleventh source is connected to the second low-level input end;

The eleventh gate and the twelfth gate are commonly connected to a fifteenth drain and a sixteenth source;

The twelfth drain is connected to the first input end; the twelfth source is connected to the first low-level input end;

The thirteenth gate is connected to the pull-down point; the thirteenth source is connected to the first low-level input end; the thirteenth drain is connected to a fifteenth gate and a fourteenth drain; the fifteenth gate is connected to the fourteenth drain;

The second pull-down control unit 2042 further comprises:

a fourteenth TFT T61, a fifteenth TFT T63 and a sixteenth TFT T64, wherein the fourteenth TFT T61 has a fourteenth gate, a fourteenth source and a fourteenth drain; the fifteenth TFT T63 has a fifteenth gate, a fifteenth source and a fifteenth drain; and the sixteenth TFT T64 has a sixteenth gate, a sixteenth source and a sixteenth drain;

The fifteenth gate is connected to the fourteenth drain; and the fifteenth drain is connected to the twelfth gate; the fifteenth source, the sixteenth drain, the fourteenth source and the fourteenth gate are commonly connected to the second input end of the low-frequency clock signal;

The sixteenth gate is connected to the first input end LC1 of the low-frequency clock signal, and the sixteenth source is connected to the twelfth gate.

The pull-down control unit further comprises a bridged unit; and the bridged unit comprises:

a seventeenth TFT T55, the seventeenth TFT T55 has a seventeenth gate, a seventeenth source and a seventeenth drain; wherein the seventeenth gate is connected to the pull-down point; the seventeenth drain (or source) is connected to the sixth gate; and the seventeenth source (or drain) is connected to the twelfth gate.

The working principle of the GOA circuit of the present invention is that: the second TFT T11 is closed when the signal ST(N−1) of the second input end of the (N−1)$^{th}$-level signal is high-level; the signal Q(N) of the pull-down point becomes a high-level signal when the signal G(N−1) of the first input end of the (N−1)$^{th}$-level signal is high-level; at this time, the third TFT T21 of the pull-up unit 202 and the fourth TFT T22 are closed and input the signal CK(n) of the input end of the n$^{th}$-level high-frequency clock signal.

Figure 5:
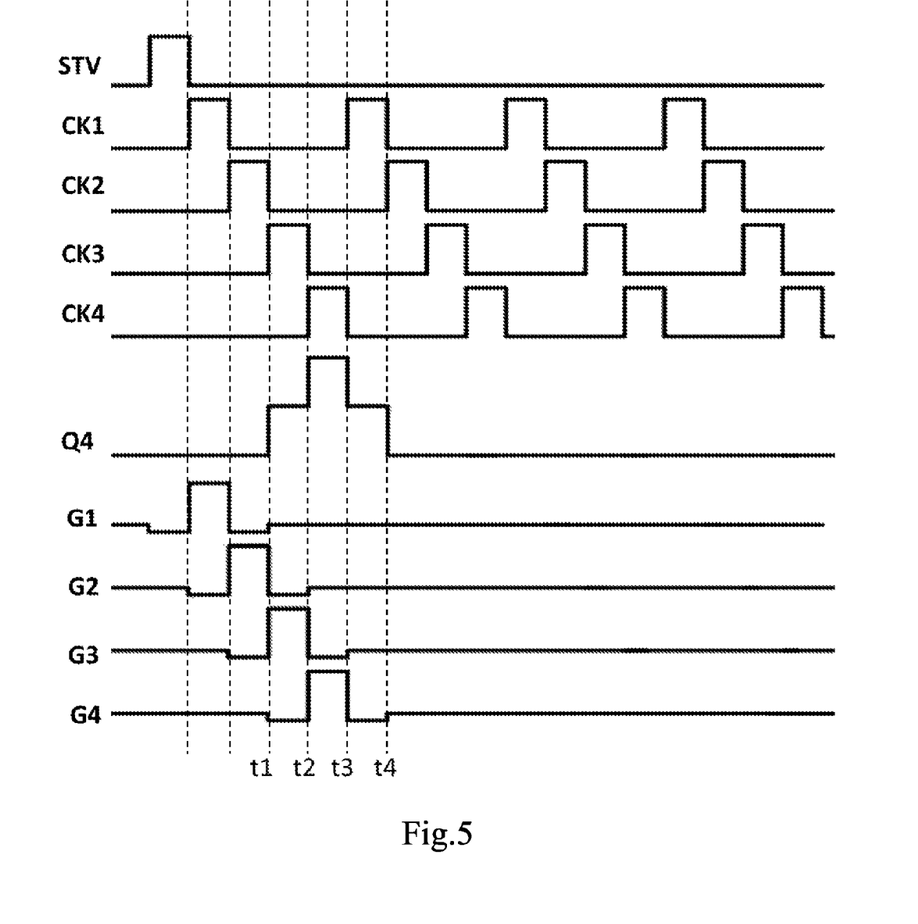
FIG. 5 is a schematic diagram of waveforms of a GOA circuit of the present invention.

FIG. 5 is a schematic diagram of waveforms of a GOA circuit of the present invention, combined with FIG. 5 to specifically explanation. For example, the GOA circuit comprises GOA units with four levels, and STV represents the start signal. The GOA circuit comprises the high-frequency clock signal with four levels (of course there can be other level numbers), the signals are CK1-CK4 respectively. For example, the first level high-frequency clock signal CK1 is input to the first level GOA unit, the second level high-frequency clock signal CK2 is input to the second level GOA unit, the third level high-frequency clock signal CK3 is input to the third level GOA unit, and the fourth level high-frequency clock signal CK4 is input to the fourth level GOA unit. The G1-04 represent signals of first output end of the GOA units with first to fourth levels respectively, and the Q4 represents a signal of the pull-down point of the fourth GOA unit. For example, the GOA circuit comprises six levels of GOA units, and the input way of the previous four levels of high-frequency clock signals of the GOA units are the same as given in the above description; the input ways of the other two levels are as follows: the first level high-frequency clock signal CK1 is input to the fifth level GOA unit, and the second level high-frequency clock signal CK2 is input to the sixth level GOA unit, and so on.

For the fourth level GOA unit, in the time t1, the signal CK3 of the first input end of the third level GOA unit is high-level so as to raise the electrical potential of the signal Q4 of the pull-down point firstly. The pull-down control unit remains the current electrical potential of the signal Q4 of the pull-down point, and the third TFT T21 is closed at the same time. Since the high-frequency clock signal CK4 of the fourth level high-frequency clock signal input end is low-level, the electrical potential of the first output end signal G4 equals the electrical potential of CK4 (the electrical potential of CK4 is lower than the electrical potential of G4 when the third TFT T21 is disconnected) at this time.

In the time t2, the high-frequency clock signal CK4 of the fourth level high-frequency clock signal input end is high-level so as to raise the electrical potential of the signal Q4 of the pull-down point again. The pull-down control unit remains the current electrical potential of the signal Q4 of the pull-down point, the electrical potential of the first output end signal G4 is high-level at this time.

In the time t3, the high-frequency clock signal CK4 of the fourth level high-frequency clock signal input end is low-level, and the electrical potential of the signal Q4 of the pull-down point is decreased firstly. The pull-down control unit remains the current electrical potential of the signal Q4 of the pull-down point. Due to the electrical potential of the pull-down point is still higher, the third TFT T21 is closed. At the same time, the high-frequency clock signal CK4 of the fourth level high-frequency clock signal input end is low-level, the electrical potential of the first output end signal G4 equals the electrical potential of CK4 (the electrical potential of CK4 is lower than the electrical potential of G4 when the third TFT T21 is disconnected).

In the time t4, the high-frequency clock signal CK2 of the (n+2)$^{th}$-level high-frequency clock signal input end is high-level. When (n+2) is greater than 4, the high-frequency clock signal of the (n+2−4)$^{th}$-level high-frequency clock signal input end corresponds to the high-frequency clock signal of the (n+2)$^{th}$-level high-frequency clock signal input end. The first TFT T41 of the pull-down unit is closed and controls the pull-down point to remain in low electrical potential so as to recover the initial low electrical potential of the signal Q(N) of the pull-down point. At this time, the third TFT T21 is disconnected, the electrical potential of the first output end signal G4 is low.

The specific control process is as follows: when the electrical potential of the pull-down point signal Q(N) is low. At this time, the pull-down control unit 204 works to make the twelfth TFT T33 and the eleventh TFT T43 to start working. Since the gate of the third TFT T21 is connected to the second low-level input end signal VSS2 through the eleventh TFT T43, the drain of the third TFT T21 is connected to the first low-level input end signal VSS1 through the twelfth TFT T33, and the electrical potential of VSS2 is lower than VSS1, so as to Vgs of the third TFT T21 is smaller than 0. Therefore, when the signal of the first output end is in the non-charging state, it is able to close the third TFT T21 favorably. This avoids the problem of electrical leakage when the voltage between gates is greater than the threshold voltage.

Figure 6:
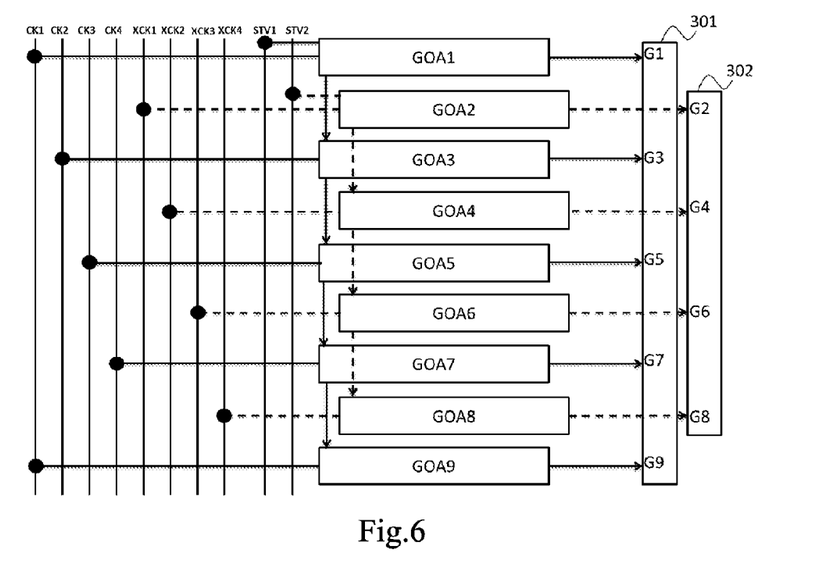
FIG. 6 is a structural diagram of a GOA circuit of the present invention.

At the same time, in order to fulfill the requirement of pre-charging, the present invention improves the structure of the GOA circuit. FIG. 6 is a structural diagram of a GOA circuit of the present invention. As illustrated in FIG. 6, the GOA circuit comprises a first cascade aspect 301 and a second cascade aspect 302, the first cascade aspect 301 and the second aspect 302 are not mutually cascaded with each other. The first cascade aspect is cascade-constructed by multiple $(2k+1)^{th}$-level GOA units (such as GOA1, GOA3, GOA5, GOA7 and GOA 9 corresponding to odd-number levels in the figures). GOA1-GOA9 represent the GOA unit corresponding to first to ninth levels respectively. The second cascade aspect is cascade-constructed by multiple the $(2k)^{th}$-level GOA units (such as GOA2, GOA4, GOA6, GOA8 and GOA 10 corresponding to even-number level in the figures). The first cascade aspect and the second cascade aspect are driven independently, wherein k is positive integer. Cascade means that the output signal of the previous level GOA unit is transmitted to the next level GOA unit. STV1 represents a start signal of the first cascade aspect 301, and STV2 represents a start signal of the second cascade aspect 302. The first cascade aspect 301 comprises the high-frequency clock signals with four levels, which are CK1-CK4. CK1-CK4 represent the high-frequency clock signals which are input from the first, third, fifth and seventh level GOA units respectively. A corresponding high-frequency clock signal of the ninth level GOA unit is CK1. The second cascade aspect 302 comprises the high-frequency clock signals with four levels, which are XCK1-XCK4. XCK1-XCK4 represent the high-frequency clock signals which are input from the second, fourth, sixth and eighth level GOA units respectively. G1-G9 represent the first output end signal of the first to ninth level GOA units respectively.

Figure 7:
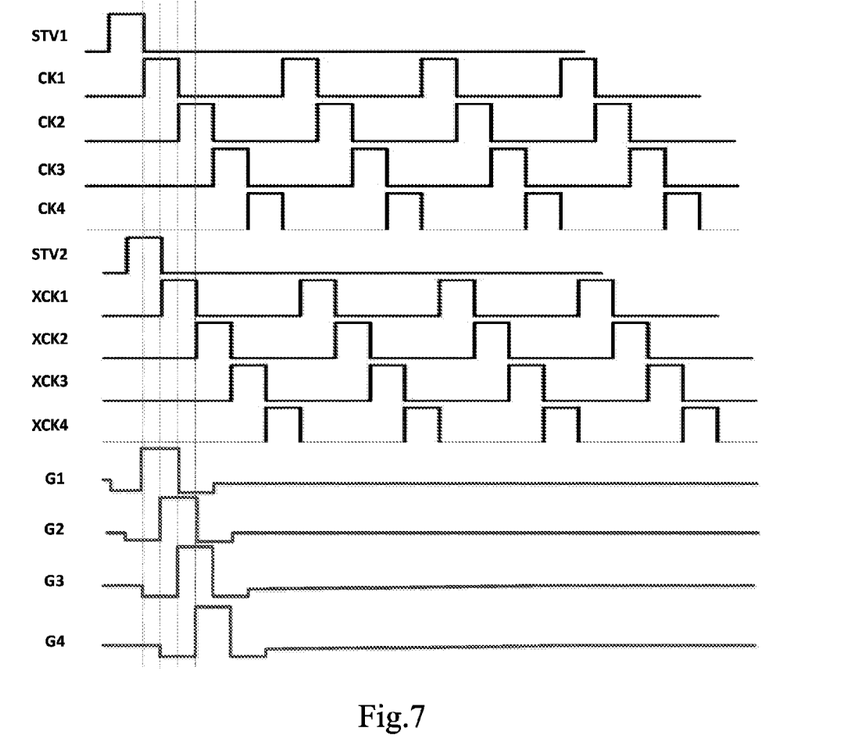
FIG. 7 is a schematic diagram of waveforms of the GOA circuit illustrated in FIG. 6 in a normal mode.

Combined with FIG. 7, FIG. 7 is a schematic diagram of waveforms of the GOA circuit illustrated in FIG. 6 at a normal mode. The period of the start signal of the second cascade aspect 302 is delayed half of a pulse width more than the period of the start signal of the first cascade aspect 301. Duty ratios of high-frequency clock signals of the first cascade aspect and the second cascade aspect are both 1/3. The high-frequency clock signal of the $(2k)^{th}$-level GOA unit is delayed half of a pulse width more than the high-frequency clock signal of the $(2k+1)^{th}$-level GOA unit. For example, the period of XCK1 is delayed half of a pulse width more than the period of CK1. The present invention uses two cascade aspects which are driven alternately. For example, CK1 drives the first GOA unit, XCK1 drives the second GOA unit, CK2 drives the third GOA unit, and XCK2 drives the fourth GOA unit; this is able to make the output signals of the two adjacent levels are overlapped, so as to implement the result of pre-charging to save charging time.

Figure 8:
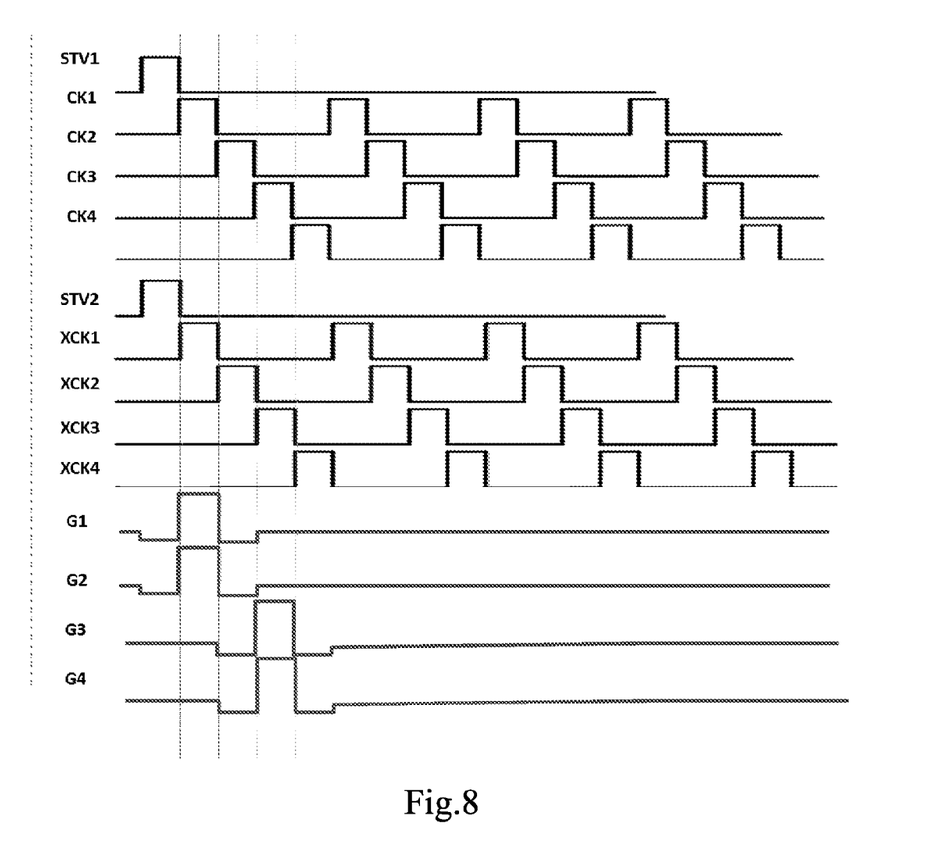
FIG. 8 is a schematic diagram of waveforms of the GOA circuit illustrated in FIG. 6 in a 3D display mode.

FIG. 8 is a schematic diagram of waveforms of the GOA circuit illustrated in FIG. 6 in a 3D display mode. As illustrated in FIG. 8, when the liquid crystal display shows a 3D-image: the period of the start signal STV2 of the second cascade aspect is the same as the period of the start signal STV1 of the first cascade aspect; the period of the high-frequency clock signal of the $(2k)^{th}$-level GOA unit is the same as the period of the high-frequency clock signal of the $(2k+1)^{th}$-level GOA unit, namely, the period of the high-frequency clock signal CK1 of the first cascade aspect is the same as the period of the high-frequency clock signal XCK1 of the second cascade aspect, the period of the high-frequency clock signal CK2 of the first cascade aspect is the same as the period of the high-frequency clock signal XCK2 of the second cascade aspect, the period of the high-frequency clock signal CK3 of the first cascade aspect is the same as the period of the high-frequency clock signal XCK3 of the second cascade aspect, and the period of the high-frequency clock signal CK4 of the first cascade aspect is the same as the period of the high-frequency clock signal XCK4 of the second cascade aspect. CK1 drives the first level GOA unit, XCK1 drives the second GOA unit, CK2 drives the third GOA unit, and XCK2 drives the fourth GOA unit. An example of output signals with four levels described herein. Since the driving method of other level numbers is the same as the above driving method, this is not enumerated herein.

The GOA circuit of the present invention solves the electrical leakage problem of a pull-down unit in the prior art by improving the pull-down unit, so as to improve the display result of a liquid crystal display.

The present invention further provides a liquid crystal display device, comprising a GOA circuit and a display area connected to the GOA circuit, the GOA circuit comprising multi-level connected GOA units and multi-level high frequency clock signals, each of the multi-level high-frequency clock signals being input through a corresponding-level high-frequency clock signal input end, wherein an $N^{th}$-level GOA unit comprises:

a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n represents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end is connected to a second input end of the $(N-1)^{th}$-level signal of the $(N+1)^{th}$-level GOA unit; and the first output end is used to offer a scanning signal to an $N^{th}$-level horizontal scan line of a display area;

The $N^{th}$-level GOA unit further comprises;
a pull-up control unit connected to the first input end of the $(N-1)^{th}$-level signal, the second input end of the $(N-1)^{th}$-level signal and the pull-down point respectively; wherein the pull-up control unit is used to pull up an electrical potential of the pull-down point;

a pull-up unit connected to the input end of the $n^{th}$-level high-frequency clock signal, the first output end, and the second output end respectively; wherein the pull-up unit and the pull-up control unit are commonly connected the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state;

a pull-down unit comprising a first TFT, wherein the pull-down unit is connected to the input end of the $(n+2)^{th}$-level high-frequency clock signal and the pull-up control unit respectively; the pull-down unit, the pull-up unit and the pull-up control unit are commonly connected to the pull-down point so as to pull-down the electrical potential of the pull-down point.

The liquid crystal display device of the present invention is able to comprise any type of the above GOA circuits. The GOA circuits have been described in detail hereinabove and so are not repeated here.

The liquid crystal display device of the present invention solves the electrical leakage problem of a pull-down unit in the prior art by improving the pull-down unit, so as to improve the display result of a liquid crystal display.

In summary, the present invention has been disclosed with preferred embodiments thereof, but the above described preferred embodiments are not intended to limit the present invention. Those who are skilled in the art can make many changes and modifications to the described embodiment which can be carried out without departing from the scope and the spirit of the invention that is intended to be limited only by the appended claims.

What is claimed is:

1. A GOA (gate driver on array) circuit, comprising multi-level connected GOA units and multi-level high frequency clock signals, each of the multi-level high-frequency clock signals being input through a corresponding-level high-frequency clock signal input end, wherein an $N^{th}$-level GOA unit comprises:

a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n represents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end is connected to a second input end of the $(N-1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprising:

a pull-up control unit connected to the first input end of the $(N-1)^{th}$-level signal, the second input end of the $(N-1)^{th}$-level signal and the pull-down point respectively; the pull-up control unit used to pull up an electrical potential of the pull-down point;

a pull-up unit connected to the input end of the $n^{th}$-level high-frequency clock signal, the first output end and the second output end respectively; wherein the pull-up unit and the pull-up control unit are commonly connected to the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprising a first TFT, wherein the first TFT has a first gate, a first source and a first drain; the first gate is electrically connected to the input end of the $(n+2)^{th}$-level high-frequency clock signal; the first source, the pull-up unit and the pull-up control unit are commonly connected to the pull-down point; and the first drain and the pull-down control unit are commonly connected to the first output end so as to pull-down the electrical potential of the pull-down point;

wherein the GOA circuit comprises a first cascade aspect and a second cascade aspect, the first cascade aspect and the second aspect are not mutually cascaded with each other, the first cascade aspect is composed by multiple $(2k+1)^{th}$-level GOA units cascaded, the second cascade aspect is composed by multiple $(2k)^{th}$-level GOA units cascaded, and the first cascade aspect and the second cascade aspect are driven independently, wherein k is a positive integer.

2. The GOA circuit according to claim 1, wherein duty ratios of clock signals of the first cascade aspect and the second cascade aspect are both 1/3.

3. The GOA circuit according to claim 1, wherein the pull-up control unit comprises a second TFT; and the second TFT has a second gate, a second source and a second drain;

wherein the second gate is connected to the second input end of the $(N-1)^{th}$ signal; the second drain is connected to the first signal input end of the $(N-1)^{th}$ signal; and the second source is connected to the pull-down point.

4. The GOA circuit according to claim 3, wherein the pull-up unit comprises a capacitor, a third TFT and a fourth TFT; the third TFT has a third gate, a third source and a third drain; and the fourth TFT has a fourth gate, a fourth source and a fourth drain;

wherein the third gate, the fourth gate and an end of the capacitance are commonly connected to the pull-down point; the third drain and the fourth drain are commonly connected to the input end of the $n^{th}$-level high-frequency clock signal; the third source and the other end of the capacitance are connected to the first output end; and the fourth source is connected to the second output end.

5. The GOA circuit according to claim 4, wherein the low-level input end comprises a first low-level input end and a second low-level input end; the $N^{th}$-level GOA unit further comprises a first input end of a low-frequency clock signal and a second input end of the low-frequency clock signal; the pull-down control unit comprises a first pull-down control unit; and the first pull-down control unit comprises:

a fifth TFT, a sixth TFT and a seventh TFT, wherein the fifth TFT has a fifth gate, a fifth source and a drain; the sixth TFT has a sixth gate, a sixth source and a sixth drain; and the seventh TFT has a seventh gate, a seventh source and a seventh drain;

wherein the fifth source is connected to the second source; the fifth drain is connected to the second low-level input end; and the fifth gate and the sixth gate are commonly connected to a ninth source and a tenth drain;

wherein the sixth source is connected to the first output end; and the sixth drain is connected to the first low-level input end;

wherein the seventh gate is connected to the pull-down point; the seventh drain is connected to the first low-level input end; and the seventh source is connected to a ninth gate and an eighth source;

the first pull-down control unit further comprising:

an eighth TFT, a ninth TFT and a tenth TFT, wherein the eighth TFT has an eighth gate, an eighth source and an eighth drain; the ninth TFT has a ninth gate, a ninth source and a ninth drain; and the tenth TFT has a tenth gate, a tenth source and a tenth drain;

wherein the eighth gate, the eighth drain, the ninth drain and the tenth source are commonly connected to the first input end of the low-frequency clock signal;

wherein the ninth gate is connected to the eighth source, and the ninth source is connected to the sixth gate;

wherein the tenth gate is connected to the second input end of the low-frequency clock signal; and the tenth drain is connected to the sixth gate.

6. The GOA circuit according to claim 5, wherein the pull-down control unit further comprises a second pull-down control sub-unit; and the second pull-down control unit comprises:

an eleventh TFT, a twelfth TFT and a thirteenth TFT, wherein the eleventh TFT has an eleventh gate, an eleventh source and an eleventh drain; the twelfth TFT has a twelfth gate, a twelfth source and a twelfth drain; and the thirteenth TFT has a thirteenth gate, a thirteenth source and a thirteenth drain;

wherein the eleventh drain is connected to the pull-up point; the eleventh source is connected to the second low-level input end; and the eleventh gate and the twelfth gate are commonly connected to a fifteenth drain and a sixteenth source;

wherein the twelfth drain is connected to the first input end; and the twelfth source is connected to the first low-level input end;

wherein the thirteenth gate is connected to the pull-down point; the thirteenth source is connected to the first low-level input end; and the thirteenth drain is connected to a fifteen gate and a fourteenth drain;

the second pull-down control unit further comprising:

a fourteenth TFT, a fifteenth TFT and a sixteenth TFT, wherein the fourteenth TFT has a fourteenth gate, a fourteenth source and a fourteenth drain; the fifteenth TFT has a fifteenth gate, a fifteenth source and a fifteenth drain; and the sixteenth TFT has a sixteenth gate, a sixteenth source and a sixteenth drain;

wherein the fourteenth source, the fourteenth gate, the fifteenth source and the sixteenth drain are commonly connected to the second input end of the low-frequency clock signal;

wherein the fifteenth gate is connected to the fourteenth drain; and the fifteenth drain is connected to the twelfth gate;

wherein the sixteenth gate is connected to the first input end of the low-frequency clock signal; and the sixteenth source is connected to the twelfth gate.

7. The GOA circuit according to claim 6, wherein the pull-down control unit further comprises a bridged unit, and the bridged unit comprises:

a seventeenth TFT having a seventeenth gate, a seventeenth source and a seventeenth drain, wherein the seventeenth gate is connected to the pull-down point; the seventeenth drain is connected to the sixth gate; and the seventeenth source is connected to the twelfth gate.

8. A GOA (gate driver on array) circuit, comprising multi-level connected GOA units and multi-level high frequency clock signals, each of the multi-level high-frequency clock signals being input through a corresponding-level high-frequency clock signal input end, wherein a $N^{th}$-level GOA unit comprises:

a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of an $n^{th}$-level high-frequency clock signal, wherein N is a positive integer greater than 3; n is positive integer; and n presents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end connected to a second input end of the $(N-1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprising:

a pull-up control unit connected to the first input end of the $(N-1)^{th}$-level signal, the second input end of the $(N-1)^{th}$-level signal and the pull-down point respectively; the pull-up control unit used to pull up an electrical potential of the pull-down point;

a pull-up unit connected to the input end of the $n^{th}$-level high-frequency clock signal, the first output end and the second output end respectively; wherein the pull-up unit and the pull-up control unit are commonly connected to the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprising a first TFT, wherein the pull-down unit is connected to the input end of the $(n+2)^{th}$-level high-frequency clock signal and the pull-up control unit respectively; the pull-down unit, the pull-up unit and the pull-up control unit are commonly connected to the pull-down point so as to pull-down the electrical potential of the pull-down point.

9. The GOA circuit according to claim 8, wherein the first TFT has a first gate, a first source and a first drain;

wherein the first gate is electrically connected to the input end of the $(n+2)^{th}$-level high-frequency clock signal; the first source is electrically connected to the pull-down point; and the first drain and the pull-down control unit are commonly connected to the first output end.

10. The GOA circuit according to claim 8, wherein the GOA circuit comprises a first cascade aspect and a second cascade aspect; the first cascade aspect and the second aspect are not mutually cascaded with each other; the first cascade aspect is composed by multiple $(2k+1)^{th}$-level GOA units cascaded; the second cascade aspect is composed by multiple $(2k)^{th}$-level GOA units cascaded; and the first cascade aspect and the second cascade aspect are driven independently, wherein k is a positive integer.

11. The GOA circuit according to claim 10, wherein duty ratios of clock signals of the first cascade aspect and the second cascade aspect are both 1/3.

12. The GOA circuit according to claim 8, wherein the pull-up control unit comprises a second TFT; and the second TFT has a second gate, a second source and a second drain;
wherein the second gate is connected to the second input end of the $(N-1)^{th}$ signal; the second drain is connected to the first signal input end of the $(N-1)^{th}$ signal; and the second source is connected to the pull-down point.

13. The GOA circuit according to claim 12, wherein the pull-up unit comprises a capacitor, a third TFT and a fourth TFT; the third TFT comprises a third gate, a third source and a third drain; and the fourth TFT comprises a fourth gate, a fourth source and a fourth drain;
wherein the third gate, the fourth gate and an end of the capacitance are commonly connected to the pull-down point; the third drain and the fourth drain are commonly connected to the input end of the $n^{th}$-level high-frequency clock signal; the third source and the other end of the capacitance are connected to the first output end; and the fourth source is connected to the second output end.

14. The GOA circuit according to claim 13, wherein the low-level input end comprises a first low-level input end a second low-level input end; the $N^{th}$-level GOA unit further comprises a first input end of a low-frequency clock signal and a second input end of the low-frequency clock signal; the pull-down control unit comprises a first pull-down control unit; and the first pull-down control unit comprises:
a fifth TFT, a sixth TFT and a seventh TFT, wherein the fifth TFT has a fifth gate, a fifth source and a drain; the sixth TFT has a sixth gate, a sixth source and a sixth drain; and the seventh TFT has a seventh gate, a seventh source and a seventh drain;
wherein the fifth source is connected to the second source; the fifth drain is connected to the second low-level input end; and the fifth gate and the sixth gate are commonly connected to a ninth source and a tenth drain;
wherein the sixth source is connected to the first output end; and the sixth drain is connected to the first low-level input end;
wherein the seventh gate is connected to the pull-down point; the seventh drain is connected to the first low-level input end; and the seventh source is connected to a ninth gate and an eighth source;
the first pull-down control unit further comprising:
an eighth TFT, a ninth TFT and a tenth TFT, wherein the eighth TFT has an eighth gate, an eighth source and an eighth drain; the ninth TFT has a ninth gate, a ninth source and a ninth drain; and the tenth TFT has a tenth gate, a tenth source and a tenth drain;
wherein the eighth gate, the eighth drain, the ninth drain and the tenth source are commonly connected to the first input end of the low-frequency clock signal;
wherein the ninth gate is connected to the eighth source; and the ninth source is connected to the sixth gate;
wherein the tenth gate is connected to the second input end of the low-frequency clock signal; and the tenth drain is connected to the sixth gate.

15. The GOA circuit according to claim 14, wherein the pull-down control unit further comprises a second pull-down control sub-unit, and the second pull-down control unit comprises:
an eleventh TFT, a twelfth TFT and a thirteenth TFT, wherein the eleventh TFT has an eleventh gate, an eleventh source and an eleventh drain; the twelfth TFT has a twelfth gate, a twelfth source and a twelfth drain; and the thirteenth TFT has a thirteenth gate, a thirteenth source and a thirteenth drain;
wherein the eleventh drain is connected to the pull-up point; the eleventh source is connected to the second low-level input end; and the eleventh gate and the twelfth gate are commonly connected to a fifteenth drain and a sixteenth source;
wherein the twelfth drain is connected to the first input end; and the twelfth source is connected to the first low-level input end;
wherein the thirteenth gate is connected to the pull-down point; the thirteenth source is connected to the first low-level input end; and the thirteenth drain is connected to a fifteen gate and a fourteenth drain;
the second pull-down control unit further comprising:
a fourteenth TFT, a fifteenth TFT and a sixteenth TFT, wherein the fourteenth TFT has a fourteenth gate, a fourteenth source and a fourteenth drain; the fifteenth TFT has a fifteenth gate, a fifteenth source and a fifteenth drain; and the sixteenth TFT has a sixteenth gate, a sixteenth source and a sixteenth drain;
wherein the fourteenth source, the fourteenth gate, the fifteenth source and the sixteenth drain are commonly connected to the second input end of the low-frequency clock signal;
wherein the fifteenth gate is connected to the fourteenth drain; and the fifteenth drain is connected to the twelfth gate;
wherein the sixteenth gate is connected to the first input end of the low-frequency clock signal; and the sixteenth source is connected to the twelfth gate.

16. The GOA circuit according to claim 15, wherein the pull-down control unit further comprises a bridged unit; and the bridged unit comprises:
a seventeenth TFT having a seventeenth gate, a seventeenth source and a seventeenth drain, wherein the seventeenth gate is connected to the pull-down point; the seventeenth drain is connected to the sixth gate; and the seventeenth source is connected to the twelfth gate.

17. A liquid crystal display device, comprising a GOA circuit and a display area connected to the GOA circuit, the GOA circuit comprising multi-level connected GOA units and multi-level high frequency clock signals, each of the multi-level high-frequency clock signals being input through a corresponding-level high-frequency clock signal input end, wherein an $N^{th}$-level GOA unit comprises:
a first input end of an $(N-1)^{th}$-level signal, a second input end of the $(N-1)^{th}$-level signal, an input end of an $(n+2)^{th}$-level high-frequency clock signal, a first input end, a second input end, a pull-down point, a low-level input end and an input end of a $n^{th}$-level high-frequency clock signal, wherein N is a positive integer greater than 3; n is positive integer; and n represents a level number of the high-frequency clock signal which is comprised in the GOA circuit;

wherein the first input end of the $(N-1)^{th}$-level signal is connected to a first output end of an $(N-1)^{th}$-level GOA unit; the second input end of the $(N-1)^{th}$-level signal is connected to a second output end of the $(N-1)^{th}$-level GOA unit; the first output end is connected to a first input end of an $(N-1)^{th}$-level signal of an $(N+1)^{th}$-level GOA unit; the second output end is connected to a second input end of the $(N-1)^{th}$-level signal of the $(N+1)^{th}$-level GOA unit; and the first output end is used to offer a scanning signal to an $N^{th}$-level horizontal scan line of a display area;

the $N^{th}$-level GOA unit further comprising:

a pull-up control unit connected to the first input end of the $(N-1)^{th}$-level signal, the second input end of the $(N-1)^{th}$-level signal and the pull-down point respectively; wherein the pull-up control unit is used to pull up an electrical potential of the pull-down point;

a pull-up unit connected to the input end of the $n^{th}$-level high-frequency clock signal, the first output end, and the second output end respectively; wherein the pull-up unit and the pull-up control unit are commonly connected the pull-down point; and the pull-up unit is used to charge signals of the first output end and the second output end so as to raise the pull-down point to a higher electrical potential;

a pull-down control unit connected to the low-level input end, the pull-up control unit, the pull-up unit and the pull-down unit respectively; wherein the pull-down control unit is used to control the pull-down point and the first output end to remain at a low electrical potential when the signal of the first output end is in a non-charging state; and a pull-down unit comprising a first TFT, wherein the pull-down unit is connected to the input end of the $(n+2)^{th}$-level high-frequency clock signal and the pull-up control unit respectively; the pull-down unit, the pull-up unit and the pull-up control unit are commonly connected to the pull-down point so as to pull-down the electrical potential of the pull-down point.

18. The liquid crystal display device according to claim 17, wherein the first TFT has a first gate, a first source and a first drain;

wherein the first gate is electrically connected to the input end of the $(n+2)^{th}$-level high-frequency clock signal; the first source is electrically connected to the pull-down point; and the first drain and the pull-down control unit are commonly connected to the first output end.

19. The liquid crystal display device according to claim 17, wherein the GOA circuit comprises a first cascade aspect and a second cascade aspect; the first cascade aspect and the second aspect are not mutually cascaded with each other; the first cascade aspect is composed of multiple $(2k+1)^{th}$-level GOA units cascaded; the second cascade aspect is composed of multiple $(2k)^{th}$-level GOA units cascaded; and the first cascade aspect and the second cascade aspect are driven independently, wherein k is a positive integer.

20. The liquid crystal display device according to claim 19, wherein duty ratios of clock signals of the first cascade aspect and the second cascade aspect are both 1/3.

* * * * *